(12) United States Patent
Rivera et al.

(10) Patent No.: US 11,752,976 B1
(45) Date of Patent: Sep. 12, 2023

(54) CAPACITANCE-BASED FOREIGN OBJECT DEBRIS SENSOR

(71) Applicant: Waymo LLC, Mountain View, CA (US)

(72) Inventors: Felix Jose Alvarez Rivera, Tarzana, CA (US); Ralph Hamilton Shepard, Menlo Park, CA (US)

(73) Assignee: Waymo LLC, Mountain View, CA (US)

( * ) Notice: Subject to any disclaimer, the term of this patent is extended or adjusted under 35 U.S.C. 154(b) by 37 days.

(21) Appl. No.: 17/342,877

(22) Filed: Jun. 9, 2021

Related U.S. Application Data (63) Continuation of application No. 16/042,254, filed on Jul. 23, 2018, now Pat. No. 11,059,457.

(51) Int. Cl.
| | |
|---|---|
| *B60S 1/08* | (2006.01) |
| *G01R 27/26* | (2006.01) |
| *G01S 17/04* | (2020.01) |
| *G01S 17/89* | (2020.01) |
| *G08C 21/00* | (2006.01) |

(52) U.S. Cl.
CPC ........ *B60S 1/0851* (2013.01); *G01R 27/2605* (2013.01); *G01S 17/04* (2020.01); *G01S 17/89* (2013.01); *G08C 21/00* (2013.01)

(58) Field of Classification Search
None
See application file for complete search history.

(56) References Cited

U.S. PATENT DOCUMENTS

| | | | |
|---|---|---|---|
| 9,442,172 B2 | 9/2016 | Verghese et al. | |
| 9,726,518 B2 | 8/2017 | Widmer et al. | |
| 2013/0182328 A1 | 7/2013 | Stewart et al. | |
| 2014/0111019 A1 | 4/2014 | Roy et al. | |
| 2014/0354301 A1* | 12/2014 | Trend ................. | G01R 27/2605 |
| | | | 324/658 |
| 2016/0176384 A1 | 6/2016 | Dissette et al. | |
| 2017/0197510 A1 | 7/2017 | Curran et al. | |
| 2018/0104721 A1 | 4/2018 | Dannan | |

* cited by examiner

*Primary Examiner* — Levon J Shahinian
(74) *Attorney, Agent, or Firm* — Botos Churchill IP Law (57) ABSTRACT

The disclosure relates to detecting and clearing debris from a sensor window. For instance, a system may include the sensor window and one or more processors. The sensor window may include a transparent thin film conductor. The one or more processors may be configured to identify a change in capacitance using the transparent thin film conductor, detect debris on the sensor window using the change in capacitance, and activate a cleaning system in order to clear the detected debris from the sensor window.

22 Claims, 11 Drawing Sheets

CAPACITANCE-BASED FOREIGN OBJECT DEBRIS SENSOR

CROSS REFERENCE TO RELATED APPLICATIONS

The present application is a continuation of U.S. patent application Ser. No. 16/042,254, filed Jul. 23, 2018, the entire disclosure of which is incorporated herein by reference.

BACKGROUND

Autonomous vehicles, such as vehicles that do not require a human driver, can be used to aid in the transport of passengers or items from one location to another. Such vehicles may operate in a fully autonomous driving mode where passengers may provide some initial input, such as a destination, and the vehicle maneuvers itself to that destination. Thus, such vehicles may be largely dependent on systems that are capable of determining the location of the autonomous vehicle at any given time, as well as detecting and identifying objects external to the vehicle, such as other vehicles, stop lights, pedestrians, etc. As an example, these systems may include sensors, such as laser scanning equipment and cameras, mounted at various locations on the vehicle.

While such sensors come in many different configurations, as an example, a ("light detection and ranging") LIDAR sensor may include at least a laser light source, an optical sensor, and a controller. The laser light source provides a pulsed beam of light into the environment of the LIDAR sensor. Any light from the beam of light that is reflected off of an object back towards the LIDAR sensor is detected by the optical sensor. The distance from the reflecting object is determined by the controller and a record of the surface is recorded as an object in space. The sensor data from successive measurements can be used to generate a 3D map of the environment. The usefulness of such maps is dependent upon the sensor and laser having an unobstructed view through the sensor windows.

For instance, an area of the sensor window may become contaminated with dust, dirt, mud, salt, leaves, water, or other substances or debris that act as an optical interferent. In this regard, the optical interferent interferes with the path of the beam of light from the laser light source away from the sensor window and/or the path of reflected light from the beam of light back through the sensor window towards the optical sensor. Thus, the optical interferent may cause the LIDAR sensor to generate incorrect information for the area of the sensor window.

As a result, the performance of the LIDAR sensor can be either degraded or the data generated by the LIDAR sensor (sensor data) can become completely invalid. For example, an opaque optical interferent on the sensor window will attenuate the beam of light, blocking the function in the affected scan area. Water or other transparent liquid may not block the beam of light completely, but water may act like a lens and deflect the beam of light. Large-angle deflection has the effect of reducing the intensity of returning or reflected light, similar to the opaque optical interferent. Smaller-angle beam deflection can return incorrect data to the optical sensor, resulting in valid-looking measurements from objects in locations different than where the LIDAR sensor is actually aiming the beam of light. In some cases, the sensor data from the deflected light degraded to the point that the noise of the LIDAR sensor overwhelms the desired sensor data. Thus, the sensor data becomes useless and unusable by vehicle's computing devices, creating potentially dangerous situations.

BRIEF SUMMARY

Aspects of the disclosure provide a system for detecting and clearing debris from a sensor window. The system includes the sensor window including a transparent thin film conductor and one or more processors. The one or more processors are configured to identify a change in capacitance using the transparent thin film conductor, detect debris on the sensor window using the change in capacitance, and activate a cleaning system in order to clear the detected debris from the sensor window.

In one example, the transparent thin film conductor includes indium tin oxide. In another example, the transparent thin film conductor is etched in a particular pattern. In this example, the pattern includes a series of circles selected to reduce interference with light passing through the sensor window. In addition or alternatively, the pattern is configured to allow for detection of debris of a particular size. In addition or alternatively, the pattern includes a grid pattern having grid cells of varying size depending on location relative to a beam of light. In another example, the system also includes a sensor including a laser that produces beams of light that pass through the sensor window, the sensor being configured to detect objects in an external environment of a vehicle and generate sensor data. In another example, the one or more processors are further configured to receive sensor data from a sensor including the sensor window, the sensor being configured to detect objects in an external environment of a vehicle and generate sensor data, and to discard a portion of the sensor data based on the detected debris. In this example, the system also includes the sensor and the one or more processors are further configured to determine a location of the debris with respect to the sensor window using the transparent thin film conductor and to discard the portion of the sensor data based on the location. In another example, the system also includes a sensor configured to detect objects in an external environment of a vehicle and generate sensor data, wherein the transparent thin film conductor is arranged in a particular pattern and the one or more processors are further configured to identify an obscuration value for the pattern and use the obscuration value to adjust the sensor data.

In another example, the system also includes a sensor including a camera configured to detect objects in an external environment of a vehicle and generate sensor data, the camera having a resolution of 2 megapixels or less. In another example, the one or more processors are further configured to use the change in capacitance to classify the debris and to identify the classification to the cleaning system when activating the cleaning system. In this example, the system also includes the cleaning system, and the cleaning system is configured to use the classification to select from a plurality of options of how to clean the sensor window. In addition, the plurality of options includes a plurality of different types of cleaning solutions. In another example, the one or more processors are further configured to determine a location of the debris with respect to the sensor window and to identify the classification to the cleaning system when activating the cleaning system. In another example, the one or more processors are further configured to generate a map of the sensor window using the change in capacitance. In this example, the one or more processors are further configured to use the map to determine a percentage area of the sensor window obscured by debris. In addition, the system also includes a sensor configured to detect objects in an external environment of a vehicle and generate sensor data, and the one or more processors are further configured to compare the percentage area to a threshold value and discard the sensor data based on the comparison. In another example, the system also includes a rain sensor, and the one or more processors are further configured to use output from the rain sensor to detect the debris. In another example, the system also includes a vehicle on which a sensor including the sensor window is mounted.

DETAILED DESCRIPTION

This technology relates to detecting foreign object debris (FOD) on vehicle sensors in order to assure adequate operation. For instance, a sensor may include a cover to protect the internal sensor components from the debris. As the vehicle drives around or remains stationary for prolonged periods or in certain weather conditions, the cover itself may become dirty. As such, the functions of the internal sensor components, including the sensor, may be impeded as signals transmitted and received through a sensor window may be blocked by the debris. However, it can be difficult to detect when such debris is actually impeding the functionality of the internal sensor components. To address these issues, the debris may be detected using capacitance of the debris as well as a capacitance sensor. Thereafter, the sensor cover may be cleared based on the capacitance. This is especially critical in the case of autonomous vehicles which rely on such sensors to make driving decisions.

As noted above, a vehicle sensor may be comprised of internal sensor components, a cover for housing the sensor components, and a sensor window. The sensor components may transmit and receive one or more signals through the sensor window. As such, the sensor window may be a transparent material such as glass.

The sensor window may include a transparent thin film conductor such as indium tin oxide (ITO). Because the ITO is not completely transparent, light passing through the sensor window will be obscured somewhat. This obscuration will be affected by the size and arrangement of pattern and can also be detected and used to adjust data generated by the LIDAR sensor.

All debris has a capacitance charge, and different types of debris may exhibit different amounts of change in capacitance. As such, when debris is located on the sensor window, the capacitance may be detected using the ITO. The processors may then detect the change in capacitance and the location of that change relative to the ITO. Based on this information, a map of the capacitance differences across the sensor window may be generated. The map may be used to determine the current status of the sensor, or rather, what areas of the sensor window are obscured by debris and also the type of the debris. This may be used to adjust a position of receiver of the sensor and/or discard data that was collected through such areas. In addition, once an area of debris is identified, for instance using the map, the processors or the device may send a signal to a cleaning system in order to initiate cleaning of the sensor window.

The features described herein allow for the detection, and in some cases identification, of debris on a sensor window. This can be used to determine when to discard data as well as when and, in some cases how, to clean the sensor window. As such, the functionality of the sensor can be detected, maintained, and/or restored if needed. This may thus increase the overall safety of the vehicle which utilizes the sensor. In addition, the features may also reduce computational load and cost as the vehicle's computing devices would be able to purposefully reduce CPU/GPU teraflops by not having to process "tainted" sensor data or using a "reduced" mode that takes into account sensor conditions while driving through weather or soiling events. This may also reduce fluid and power consumption of the cleaning system which can be especially important in situations where there are weight and size restrictions for the cleaning system.

Example Systems

Figure 1:
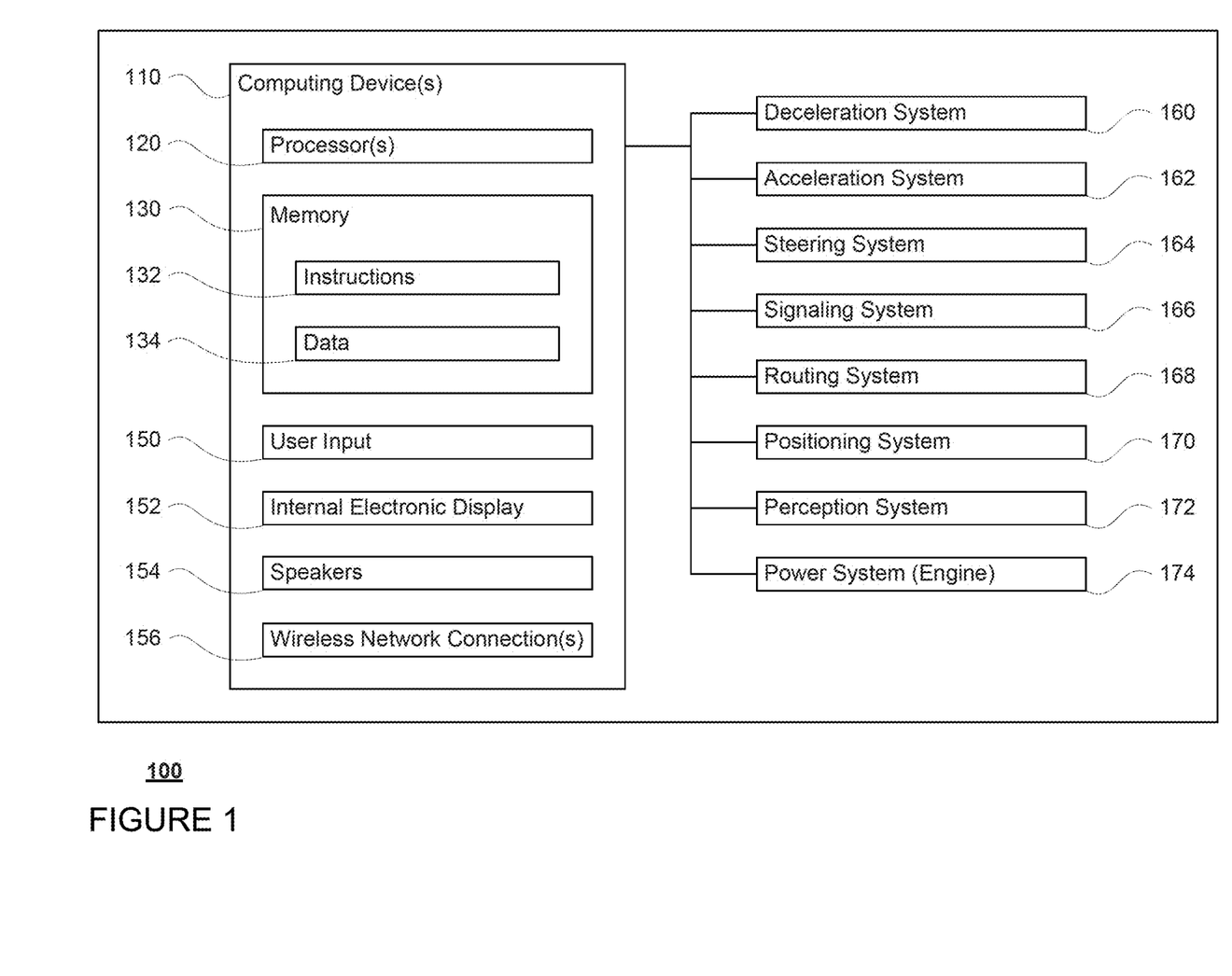
FIG. 1 is a functional diagram of an example vehicle in accordance with aspects of the disclosure according to aspects of the disclosure.

As shown in FIG. 1, a vehicle 100 in accordance with one aspect of the disclosure includes various components. While certain aspects of the disclosure are particularly useful in connection with specific types of vehicles, the vehicle may be any type of vehicle including, but not limited to, cars, trucks, motorcycles, busses, recreational vehicles, etc. The vehicle may have one or more computing devices, such as computing devices 110 containing one or more processors 120, memory 130 and other components typically present in general purpose computing devices.

The memory 130 stores information accessible by the one or more processors 120, including instructions 132 and data 134 that may be executed or otherwise used by the processor 120. The memory 130 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 132 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 134 may be retrieved, stored or modified by processor 120 in accordance with the instructions 132. For instance, although the claimed subject matter is not limited by any particular data structure, the data may be stored in computing device registers, in a relational database as a table having a plurality of different fields and records, XML documents or flat files. The data may also be formatted in any computing device-readable format.

The one or more processor 120 may be any conventional processors, such as commercially available CPUs. Alternatively, the one or more processors may be a dedicated device such as an ASIC or other hardware-based processor. Although FIG. 1 functionally illustrates the processor, memory, and other elements of computing devices 110 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing devices 110. Accordingly, references to a processor or computing device will be understood to include references to a collection of processors or computing devices or memories that may or may not operate in parallel.

Computing devices 110 may include all of the components normally used in connection with a computing device such as the processor and memory described above as well as a user input 150 (e.g., a mouse, keyboard, touch screen and/or microphone) and various electronic displays (e.g., a monitor having a screen or any other electrical device that is operable to display information). In this example, the vehicle includes an internal electronic display 152 as well as one or more speakers 154 to provide information or audio visual experiences. In this regard, internal electronic display 152 may be located within a cabin of vehicle 100 and may be used by computing devices 110 to provide information to passengers within the vehicle 100.

Computing devices 110 may also include one or more wireless network connections 156 to facilitate communication with other computing devices, such as the client computing devices and server computing devices described in detail below. The wireless network connections may include short range communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

In one example, computing devices 110 may be an autonomous driving computing system incorporated into vehicle 100. The autonomous driving computing system may be capable of communicating with various components of the vehicle in order to maneuver vehicle 100 in a fully autonomous driving mode and/or semi-autonomous driving mode. For example, returning to FIG. 1, computing devices 110 may be in communication with various systems of vehicle 100, such as deceleration system 160, acceleration system 162, steering system 164, signaling system 166, navigation system 168, positioning system 170, perception system 172, and power system 174 (for instance, a gasoline or diesel powered motor or electric engine) in order to control the movement, speed, etc. of vehicle 100 in accordance with the instructions 132 of memory 130. Again, although these systems are shown as external to computing devices 110, in actuality, these systems may also be incorporated into computing devices 110, again as an autonomous driving computing system for controlling vehicle 100.

As an example, computing devices 110 may interact with deceleration system 160 and acceleration system 162 in order to control the speed of the vehicle. Similarly, steering system 164 may be used by computing devices 110 in order to control the direction of vehicle 100. For example, if vehicle 100 is configured for use on a road, such as a car or truck, the steering system may include components to control the angle of wheels to turn the vehicle. Signaling system 166 may be used by computing devices 110 in order to signal the vehicle's intent to other drivers or vehicles, for example, by lighting turn signals or brake lights when needed.

Navigation system 168 may be used by computing devices 110 in order to determine and follow a route to a location. In this regard, the navigation system 168 and/or data 134 may store detailed map information, e.g., highly detailed maps identifying the shape and elevation of roadways, lane lines, intersections, crosswalks, speed limits, traffic signals, buildings, signs, real time traffic information, vegetation, or other such objects and information. In other words, this detailed map information may define the geometry of vehicle's expected environment including roadways as well as speed restrictions (legal speed limits) for those roadways. In addition, this map information may include information regarding traffic controls, such as traffic signal lights, stop signs, yield signs, etc., which, in conjunction with real time information received from the perception system 172, can be used by the computing devices 110 to determine which directions of traffic have the right of way at a given location.

The perception system 172 also includes one or more components for detecting objects external to the vehicle such as other vehicles, obstacles in the roadway, traffic signals, signs, trees, etc. For example, the perception system 172 may include one or more LIDAR sensors, sonar devices, radar units, cameras and/or any other detection devices that record data which may be processed by computing devices 110. The sensors of the perception system may detect objects in the external environment of the vehicle and generate sensor data describing characteristics of such objects such as location, orientation, size, shape, type, direction and speed of movement, etc. The raw sensor data from the sensors and/or the aforementioned characteristics can be quantified or arranged into a descriptive function or vector and sent for further processing to the computing devices 110. As discussed in further detail below, computing devices 110 may use the positioning system 170 to determine the vehicle's location and perception system 172 to detect and respond to objects when needed to reach the location safely.

Figure 2:
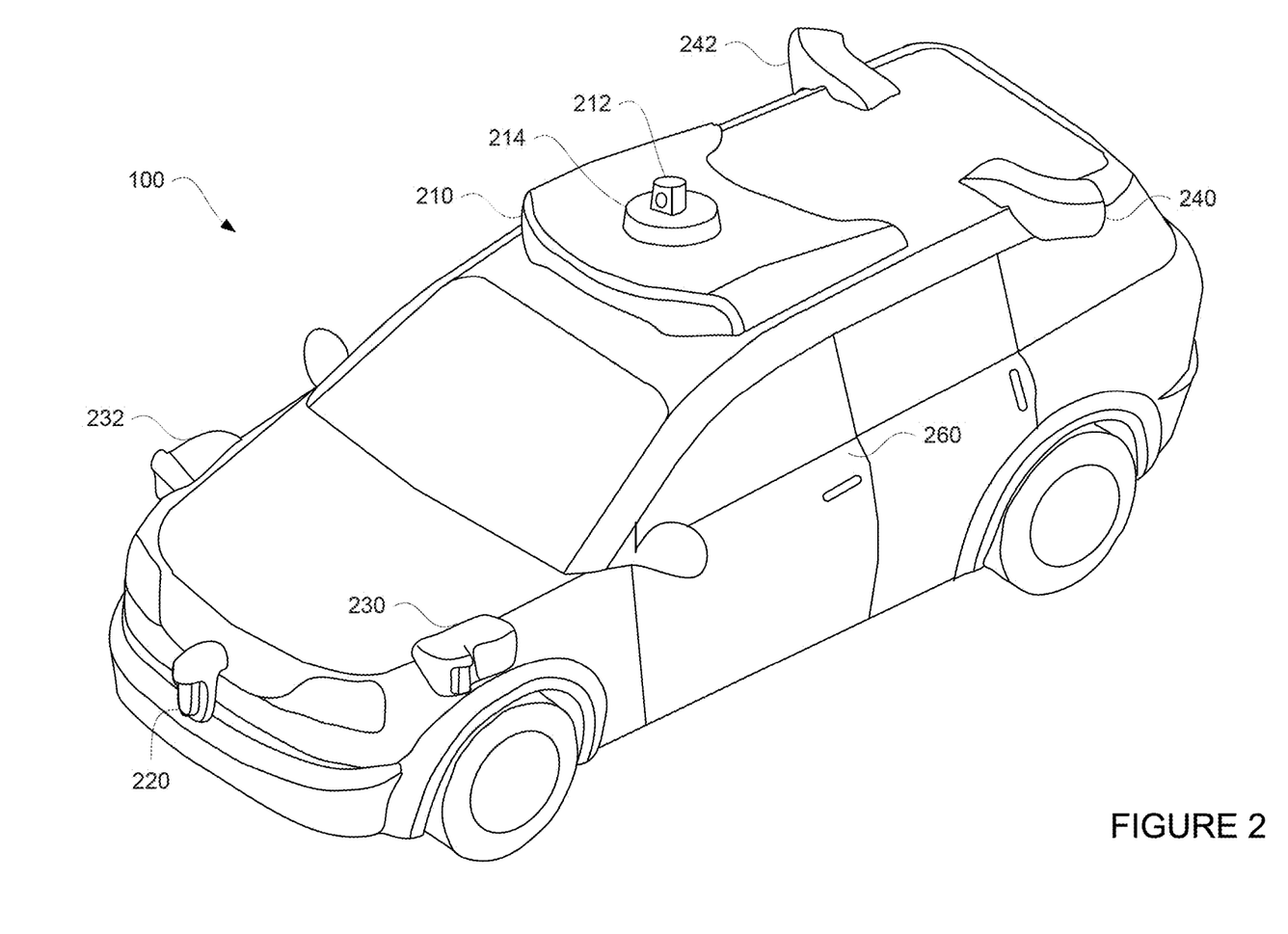
FIG. 2 is an example external view of the example vehicle of FIG. 1 in accordance with aspects of the disclosure.

For instance, FIG. 2 is an example external view of vehicle 100. In this example, rooftop housing 210 and housings 212, 214 may include a LIDAR sensor as well as various cameras and radar units. In addition, housing 220 located at the front end of vehicle 100 and housings 230, 232 on the driver's and passenger's sides of the vehicle may each store a LIDAR sensor. For example, housing 230 is located in front of driver door 260. Vehicle 100 also includes housings 240, 242 for radar units and/or cameras also located on the roof of vehicle 100. Additional radar units and cameras (not shown) may be located at the front and rear ends of vehicle 100 and/or on other positions along the roof or rooftop housing 210.

Figure 3A:
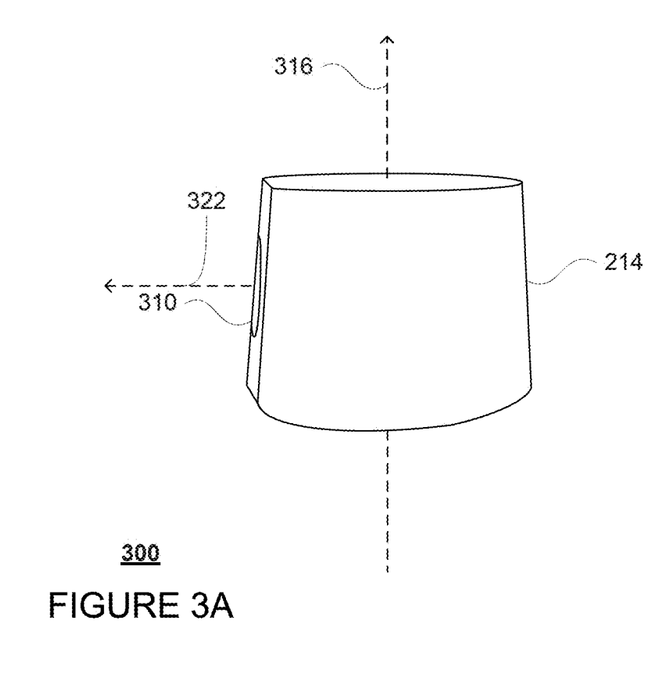
FIGS. 3A and 3B are views of an example LIDAR sensor in accordance with aspects of the disclosure.
Figure 3B:
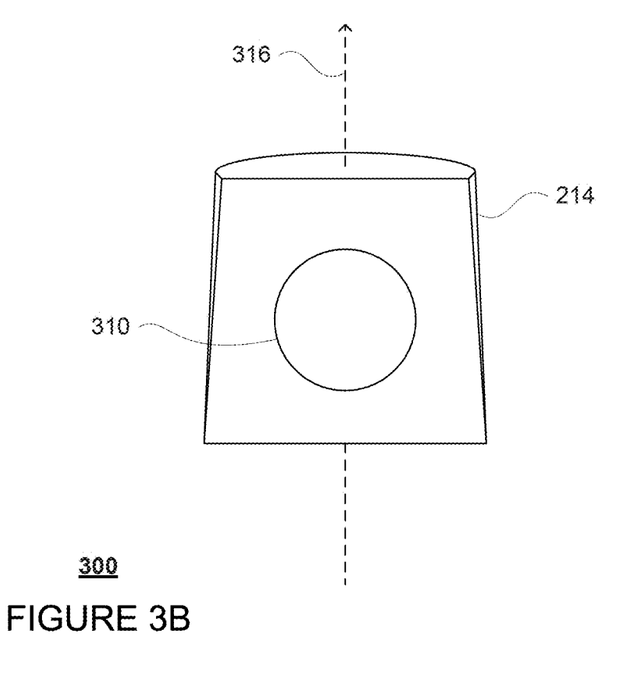

FIGS. 3A and 3B are an example configuration of a LIDAR sensor 300 including a housing 214. In the example of FIG. 3B, LIDAR sensor 300 is shown rotated 90 degrees counter-clockwise about a first axis 316 from the position of LIDAR sensor 300 as shown in FIG. 3A. In this example, housing 214 includes a sensor window 310. The housing 214 is configured to rotate about a first axis 316, thereby rotating the sensor window 310. In this regard, the housing 214 may be attached to an electric motor 440 connected to a controller 450 discussed further below.

Within the housing 214 may be a plurality of sensor components. As shown in the example functional diagram of FIG. 4, LIDAR sensor 300 includes a laser light source 420 and an optical sensor 430. The laser light source 420 may be configured to emit a beam of light along a second axis 322 (shown in FIG. 3A), perpendicular to (or in line with) the first axis. For instance, the laser light source 420 could be a semiconductor waveguide laser, a fiber laser, an excimer laser, or another type of laser system that produces a beam of light corresponding to a beam of consistent pulsed light. The emission wavelength of the laser light source 420 may be in the infrared (IR) wavelength spectrum, the visible wavelength spectrum or the ultraviolet (UV) wavelength spectrum. The beam of light is an outbound bean of light.

Figure 4:
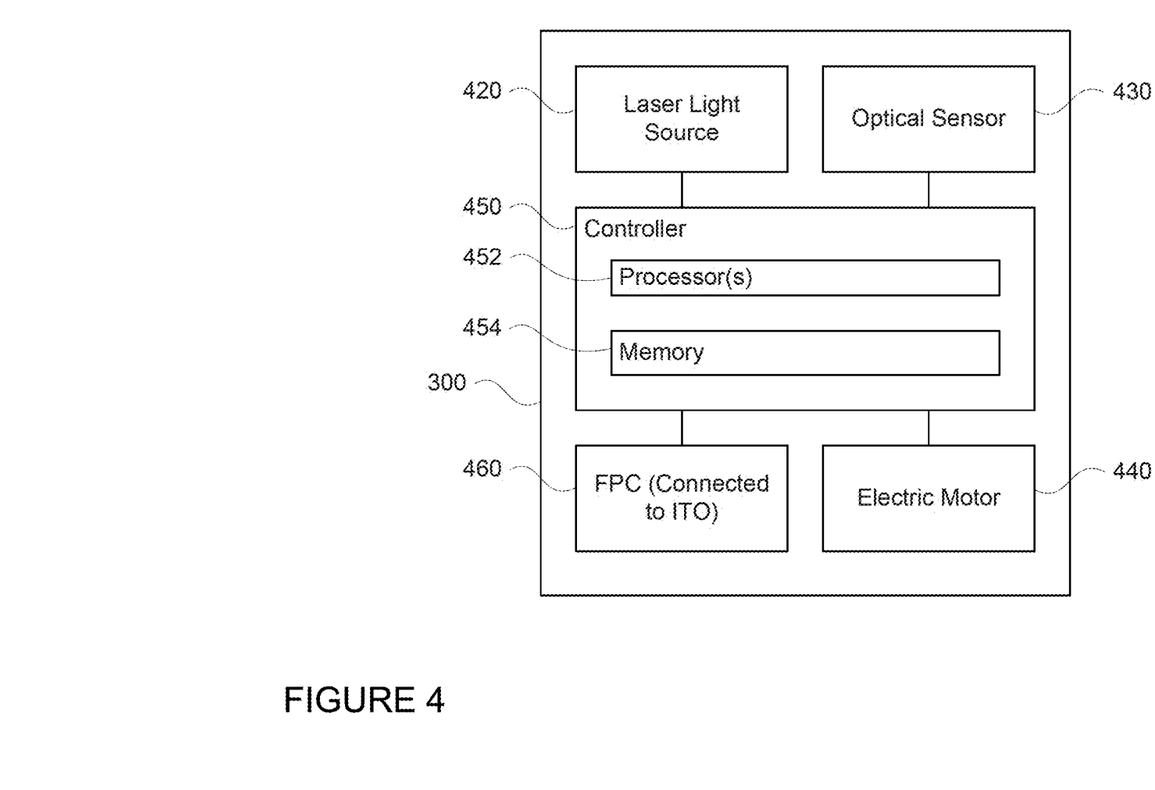
FIG. 4 is an example functional diagram of an example LIDAR sensor in accordance with aspects of the disclosure.

The optical sensor 430 may be configured to receive light from the environment around the LIDAR sensor 300 via an optical element (for example, a condenser lens). Based on the received light, the optical receiver may provide information about a scene of the environment around the LIDAR sensor 300. The optical receiver may include a detector array including a plurality of single photon avalanche detectors (SPADs) and or other types of photodetectors configured to detect light.

The controller 450 may include one or more processors 452 and memory 454, configured similarly to processors 120 and memory 130. The processors 452 may be configured to execute instructions stored in the memory so as to control the position of the laser, control the emission of a beam of light from the laser, and control rotation of housing 214 using one or more electric motors (not shown), and process data received from the sensor array. For instance, the housing 214 may rotate about the first axis 316 at a rotational frequency of about 10 Hz, or more or less.

The sensor components may transmit and receive one or more signals through the sensor window 310. As such, the sensor window may be a transparent material such as glass. The transparent material of the sensor window may also include a transparent thin film conductor such as indium tin oxide (ITO). The ITO may be applied as a film onto the sensor window.

Alternatively, the ITO may be etched or sputtered directly into the glass of the sensor window. This approach may avoid additional optical artifacts which could occur during application of a film. Also, with etching, the ITO may be applied in a particular pattern. As an example, rather than a continuous uniform layer, the pattern may include a series of geometric shapes such as rectangles, squares, rings or circles, etc. Of course, any number of different patterns may be used. The pattern may be selected in order to reduce interference with light passing through the sensor window as well as to detect objects of a particular size, such as smaller than a quarter of a millimeter in diameter.

Figure 5A:
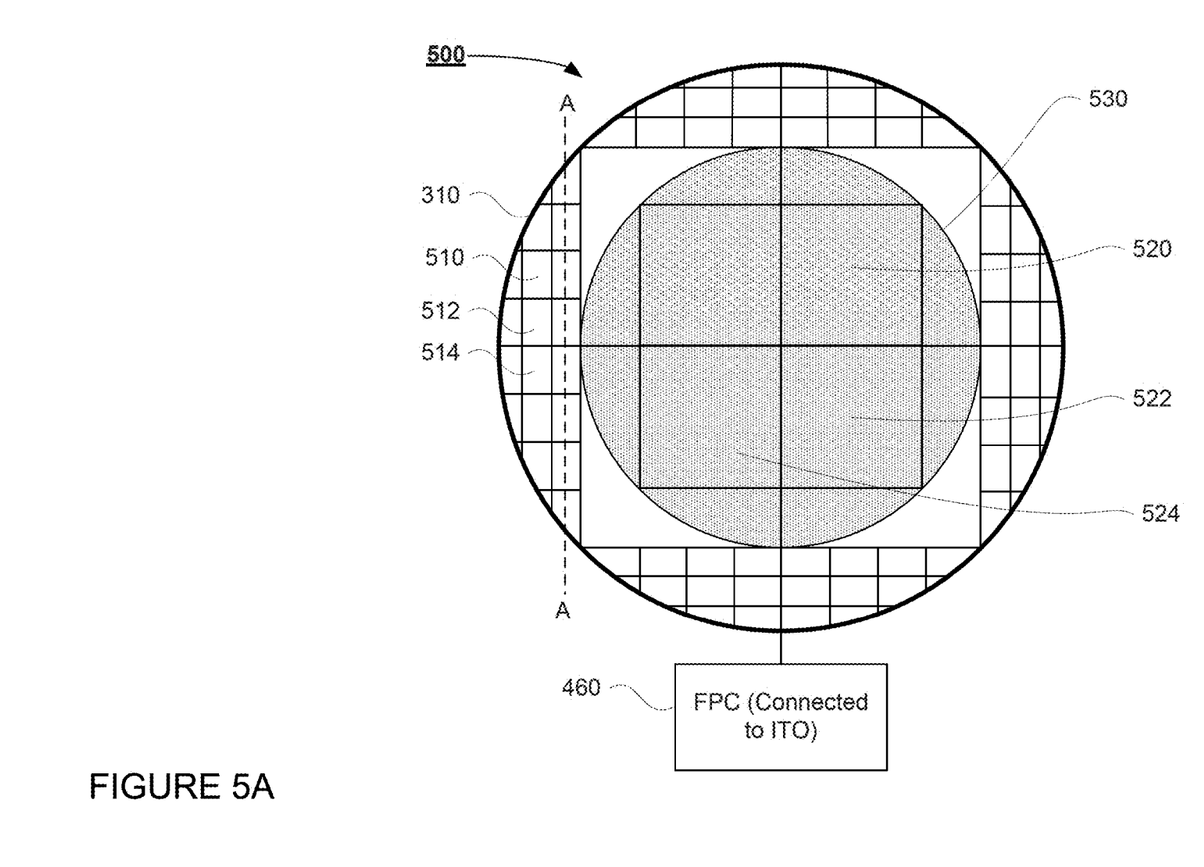
FIG. 5A is an example of a particular pattern in accordance with aspects of the disclosure.

FIG. 5A is an example of a pattern 500 that may be applied on the sensor window 310. In this example, the pattern 500 forms a grid pattern having grid cells of varying sizes. Smaller cells 510, 512, 514 are arranged as a "fine pattern" towards an outer edge of the sensor window 310 in order to allow for detection of relatively smaller FOD. Larger cells 520, 522, 524 are arranged in a "coarse pattern" in an area (represented by shaded area 530) through which the aforementioned beam of light passes. By using a coarse pattern over shaded area 530, the risk of interference with the beam of light as well as light being received by the LIDAR sensor 300 is reduced.

Figure 5B:
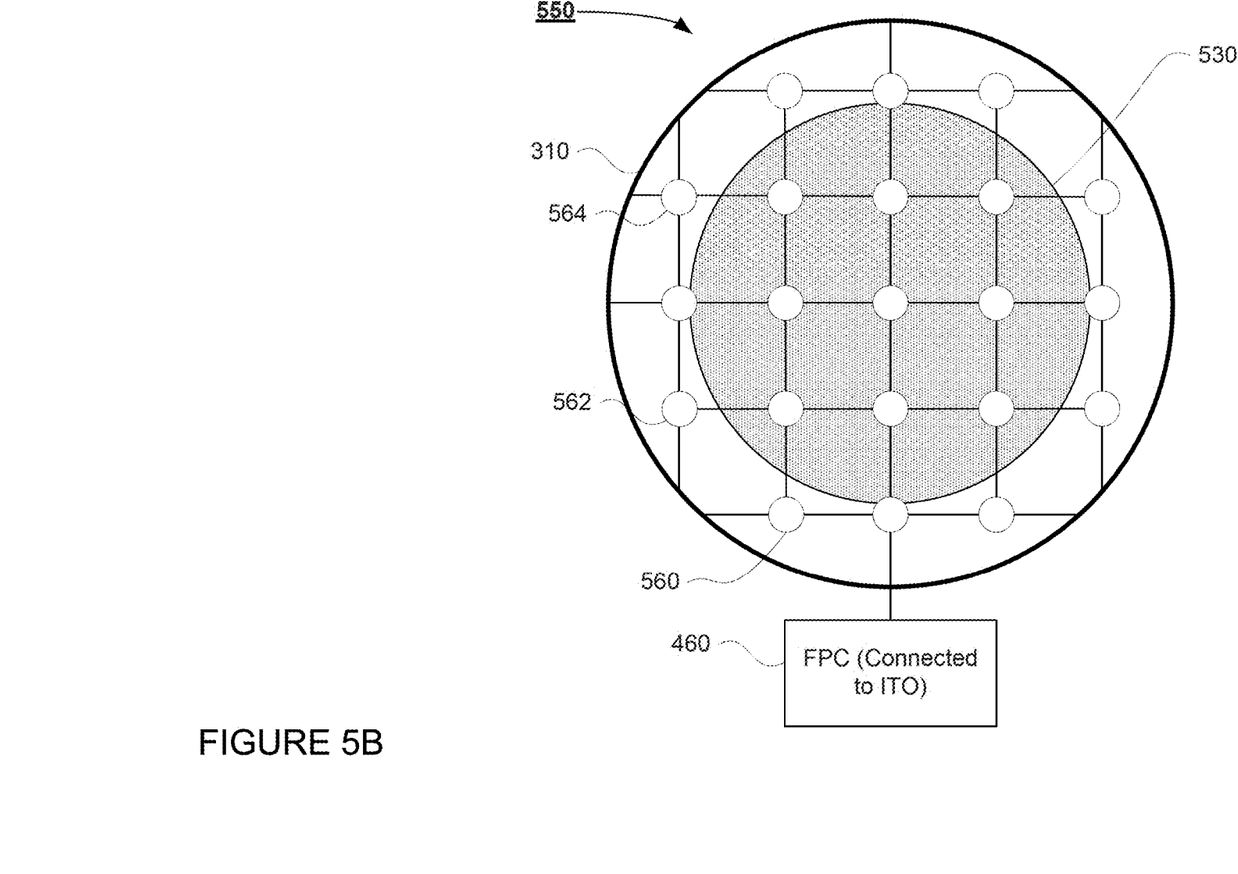
FIG. 5B is an example of a particular pattern in accordance with aspects of the disclosure.

FIG. 5B is alternative example of a pattern 550 that may be applied on the sensor window 310. In this example, the pattern 550 forms a grid with a plurality of circles 560, 562, 564. Thus, FIG. 5B represents an example of a circular pattern selected to reduce interference with light passing through the sensor window.

Because the ITO is not completely transparent, light passing through the sensor window will be obscured somewhat. For instance, in the case of a LIDAR sensor, such as LIDAR sensor 300, which utilizes a laser that produces a plurality of beams of laser light, the pattern may introduce a periodic obscuration to the beams of light passing through sensor window both when the beams of light leave the sensor cover through the sensor window and return to the sensor cover through the sensor window. This obscuration may be affected by the size and arrangement of pattern and can also be detected and used to adjust data generated by the LIDAR sensor 300. For instance, diffraction effect may be caused by a periodic pattern that causes side-lobes in the output beam. A software filter may then be designed to mitigate the effect of side lobes in the received data based on knowledge of the relative angle and intensity of the side lobes.

Figure 6:
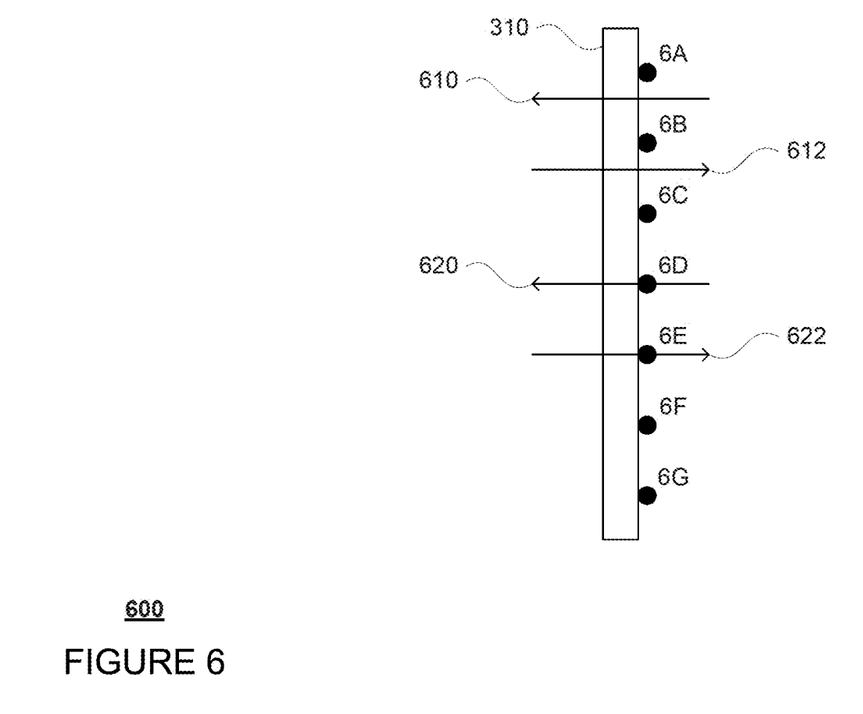
FIG. 6 is an example cross-sectional view of a sensor window in accordance with aspects of the disclosure.

FIG. 6 is an example cross-sectional view 600 of the sensor window through line A-A of FIG. 5A. In this example, the ITO pattern 500 is represented by circles 6A-6G (exaggerated in the example for the sake of clarity). When light passes through the sensor window 310 only along and in the directions of lines 610, 612, there may be a small loss. For instance, the sensor window obscures about 2% or more or less of the light (i.e. about 98% of light is able to pass through). When light passes through the ITO pattern and the sensor window, for instance through one of the circles along and in the directions of lines 620, 622, there may be a slightly larger loss. For instance, the ITO may obscure and additional 9% or more or less (i.e. about 89% of light is able to pass through). As such, the obscuration value for light passing through regions of the ITO pattern may be on the order of 11% and the overall transparency of the sensor window may drop from about 98% (without the ITO pattern) to about 94% (with the ITO pattern).

In some instances, LIDAR sensor 300 may be replaced with a camera which utilizes natural light. For higher resolution cameras, the ITO pattern (as well as other factors, such as the type of detector, the type of lens, the scene the camera is observing. etc.) may cause the camera sensor is "blinded." In such cases, other materials, such as those with a carbon nano-structure may be used. However, the effect of the ITO on lower resolution cameras, for instance, cameras with resolution lower than 2 megapixels, may be less concerning.

As shown in FIGS. 5A and 5B, one edge or a bottom portion of the ITO may be attached to a flexible printed circuit (FPC) 460 by way of an adhesive interconnect system such as an Anisotropic conductive film (ACF). The copper flex circuit may be which is connected to a PCB board with various components, such as one or more processors and memory configured similarly to processors 120 and memory 130. These processors may be configured to read the capacitance and send this information to the processors 452.

All debris has a capacitance charge. In addition, different types of debris may exhibit different amounts of change in capacitance. For instance, a bird dropping may result in a different capacitance change than dirt, gravel or water. These relationships between types of debris and capacitance change can be determined over time by testing and/or using machine learning techniques. As an example, these relationships may be stored in a table, database, or other storage structure, and may be stored locally at memory of the PCB, the controller 450, and/or computing devices 110 and used in order to classify debris.

Example Methods

In addition to the operations described above and illustrated in the figures, various operations will now be described. It should be understood that the following operations do not have to be performed in the precise order described below. Rather, various steps can be handled in a different order or simultaneously, and steps may also be added or omitted.

Referring to LIDAR sensor 300, in order to produce sensor data for processing by the computing devices 110, controller 450 may control the functioning of the LIDAR sensor 300. As noted above, the controller 450 may cause the laser light source 420 to generate a beam of light that passes through the shaded area 530 of the sensor window 310 as outgoing light and again as incoming light towards the optical sensor.

When debris is located on the sensor window 310, the capacitance of that debris may be detected using the ITO. For instance, the processors of the FPC 460 may then detect the change in capacitance relative to the ITO pattern. These processors may also detect the location of that change relative to the ITO pattern and/or sensor window. For instance, if the ITO pattern is known, how the signals change based on the location of the contamination may be inferred. Moreover, debris can still be detected if it is not on the ITO of the ITO pattern. As long as the debris is within the sensor window, the capacitance can be measured. However, the accuracy of how big the debris is may suffer.

Figure 7:
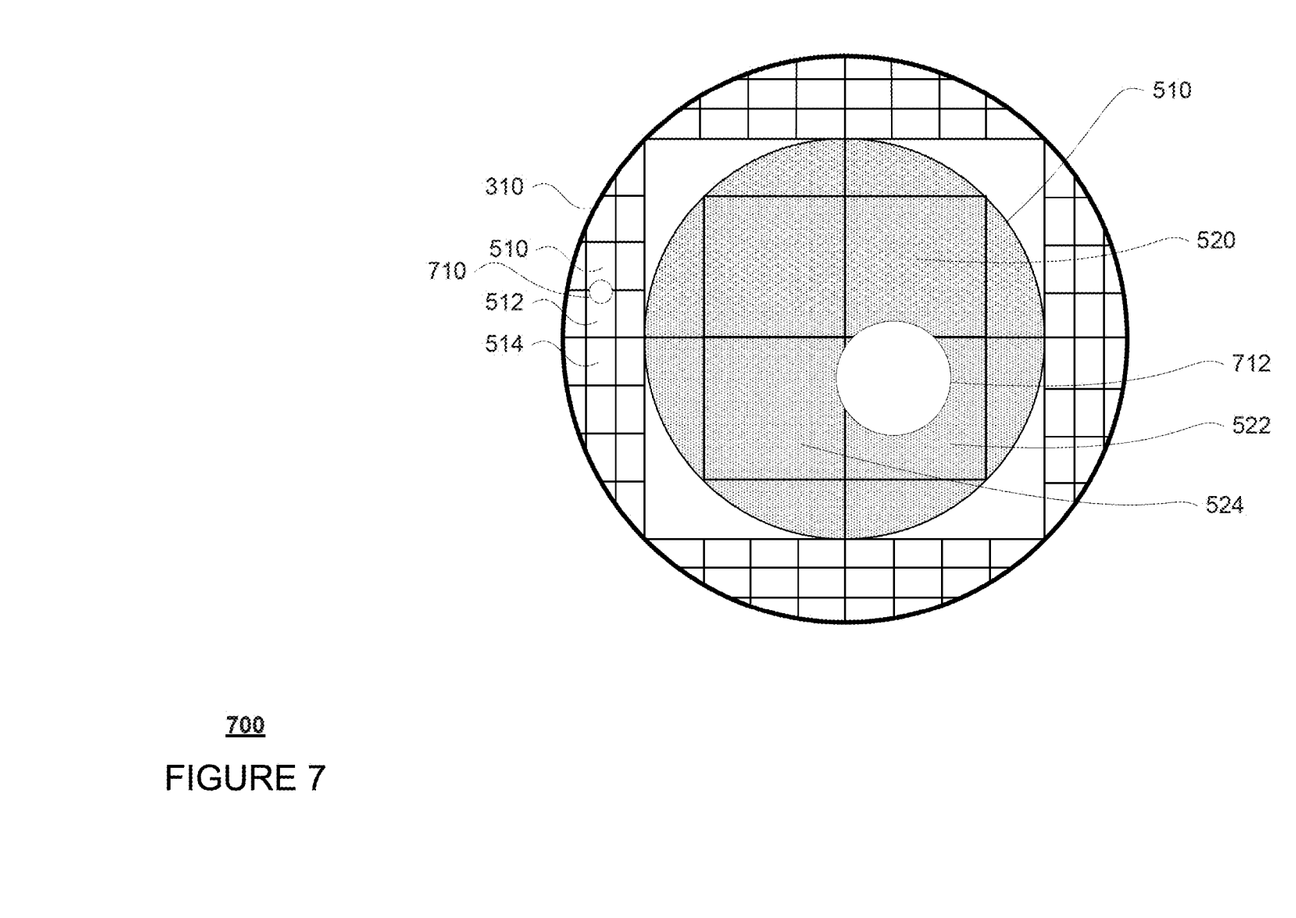
FIG. 7 is an example sensor window and debris in accordance with aspects of the disclosure.

FIG. 7 is representation 700 of sensor window 310 with pattern 500 and debris 710, 712. In this example, the processors of the FPC 460 may identify a change in capacitance between cells 510 and 512 due to the debris 710 as well as a change in capacitance between cells 520 and 522 and between cells 522 and 524 due to debris 712. The processors may further process this information or send it to another device, such as controller 450 and/or computing devices 110 for further processing.

Figure 8:
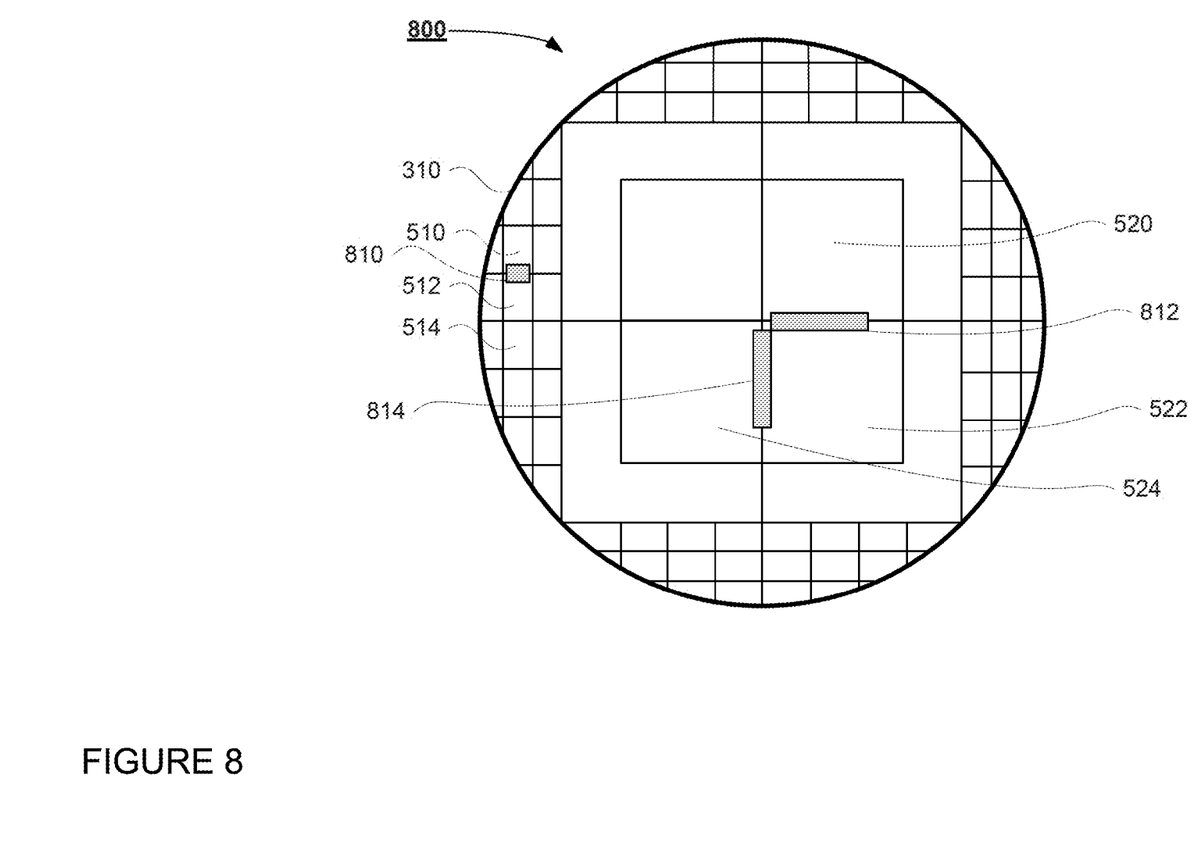
FIG. 8 is an example of a map in accordance with aspects of the disclosure.

Based on the change in capacitance and the location, a map of the capacitance differences across the sensor window may be generated by any of the processors of the FPC 460, controller 450, and/or computing devices 110. For instance, FIG. 8 is an example of a map 800 where higher capacitance areas 810, 812, 814 are shaded. These higher capacitance difference areas may indicate areas of the sensor window that are obscured by debris, and in this example, debris 710 and 712.

The map may be used to determine the current status of the sensor, or rather, what areas of the sensor window are obscured by debris by any of the processors of the FPC 460, controller 450, and/or computing devices 110. This may be used to adjust a position of receiver of the sensor and/or discard data that was collected through such areas. In addition, the map can also be used to inform the size or area that is being covered and intelligently deploy a cleaning solution that targets that specific area such as a "smart" wiper or ultrasonic piezo element mounted to the window.

The map may also identify or be used to determine what percentage area of the sensor window is obscured by debris. In some instances, the percentage area may be so high, or greater than a predetermined threshold value, which may cause the sensor data to no longer be considered acceptable or safe to use. For instance, if the percentage area is 10% and the threshold value is 25%, this may be acceptable. However, if the percentage area is 30% and the threshold value is 25%, this may not be considered acceptable. As such, data from the sensor may be discarded by the controller and/or computing device 110 such that it is not used to control the vehicle 100 in an autonomous driving mode.

Figure 9:
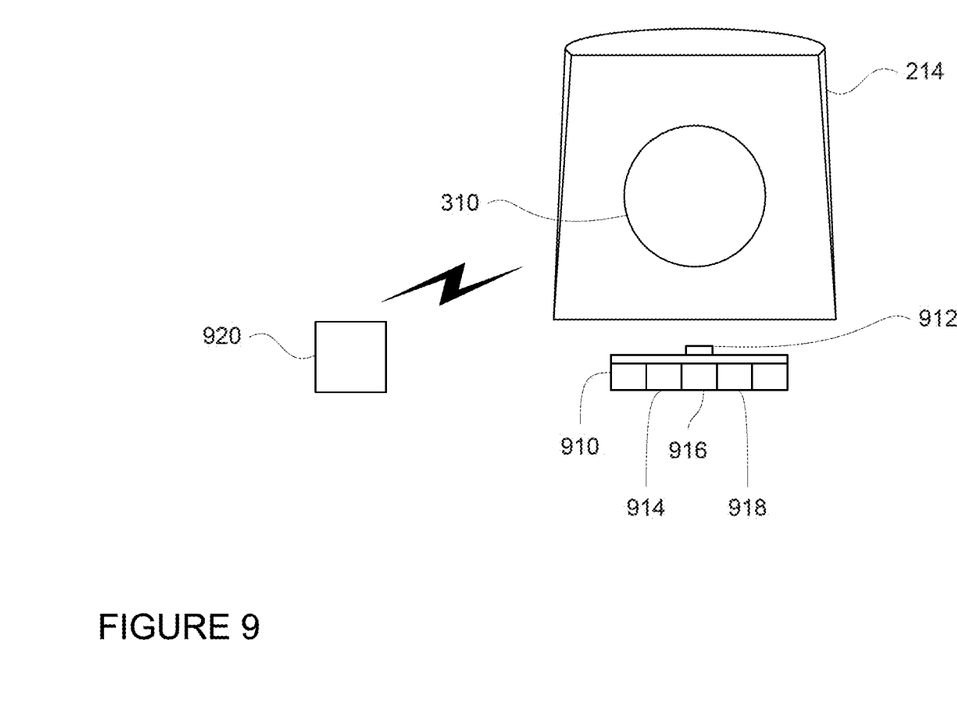
FIG. 9 is an example view of a LIDAR sensor, cleaning system, and rain sensor in accordance with aspects of the disclosure.

Once an area of debris is identified, for instance using the map, the processors of the FPC 460, controller 450, and/or computing devices 110 may send a signal to a cleaning system 910 located proximate to the housing 214, for instance at housing 212, in order to initiate cleaning of the sensor window 310. In some instances, given that the map identifies where the debris is located on the sensor window, the cleaning system 910 may be provided with the location of the debris in order to enable the cleaning system to be able to direct cleaning efforts, for instance by steering a nozzle 912 using a small electric motor (not show), towards the location of the debris.

In some instances, rain water can have different levels of charge, which can result in inconsistent capacitance changes. As such, a rain sensor 920, positioned anywhere on the vehicle that would likely be exposed to rain such as at any of housings 210, 212, 214, may output or may be used to detect whether it is currently raining. This information may be sent via wired or wireless connection to the processors of the FPC 460, controller 450, and/or computing devices 110 in order to avoid false positives or other incorrect classifications of debris.

The aforementioned relationship information may also be used the processors of the FPC 460, controller 450, and/or computing devices 110 to classify debris based on the change in capacitance. By classifying the debris, the sensor window 310 may be cleaned more effectively. For instance, the classification of the debris may be provided to the cleaning system. The cleaning system 910 may include a plurality of different cleaning options. As an example, the cleaning system may include a plurality of reservoirs or cartridges 914, 916, 918 that include different types of cleaners, cleaning solutions, or cleaning approaches for different types of debris. As an example, dirt may be removed using one type of cleaning fluid such as water or a stream of air, whereas bird droppings may be removed using an organic cleaning fluid.

In addition, the classification may be used the processors of the FPC 460, controller 450, and/or computing devices 110 to determine how to treat the sensor data. For instance, some debris may be transparent, thus by increasing the power of the sensor, the sensor may be able to see "through" the debris. As another instance, if the debris is classified as water (i.e. rain), the vehicle's perception system may automatically determine that the sensor data will include rain data and automatically determine a reduction in the range of the sensor. As a result, the vehicle may be driven more "cautiously."

Figure 10:
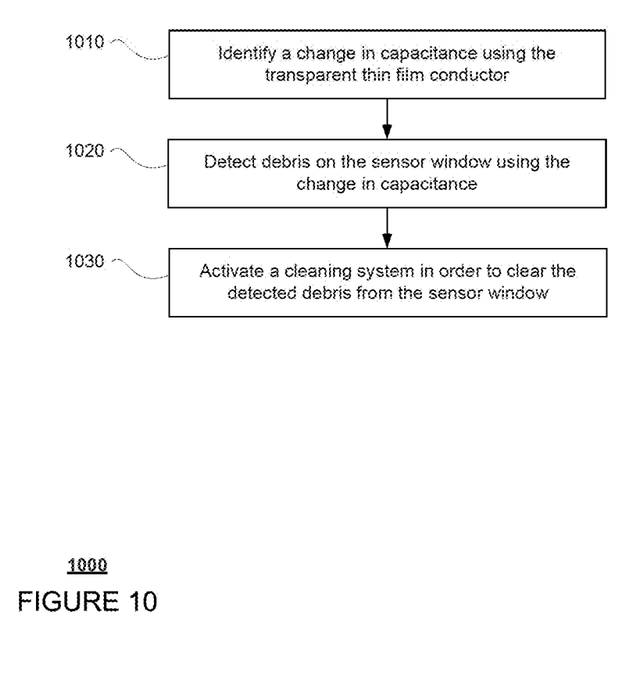
FIG. 10 is an example flow diagram in accordance with aspects of the disclosure.

FIG. 10 is an example flow diagram 1000 for detecting and clearing debris from a sensor window in accordance with some of the aspects described herein and that may be performed by one or more processors of the FPC 460, controller 450, and/or computing devices 110. In this example, a chance in capacitance is identified using a transparent thin film conductor of a sensor window at block 1010. Debris is detected on the sensor window using the change in capacitance at block 1020. A cleaning system is activated in order to clear the detected debris from the sensor window at block 1030.

Again, the features described herein allow for the detection, and in some cases identification, of debris on a sensor window. This can be used to determine when to discard data as well as when and, in some cases how, to clean the sensor window. As such, the functionality of the sensor can be detected, maintained, and/or restored if needed. This may thus increase the overall safety of the vehicle which utilizes the sensor. In addition, the features may also reduce computational load and cost as the vehicle's computing devices would be able to purposefully reduce CPU/GPU teraflops by not having to process "tainted" sensor data or using a "reduced" mode that takes into account sensor conditions while driving through weather or soiling events. This may also reduce fluid and power consumption of the cleaning system which can be especially important in situations where there are weight and size restrictions for the cleaning system.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A sensor, comprising:
a housing;
a sensor window including a transparent film conductor consisting of indium tin oxide (ITO) that detects capacitance differences across the sensor window due to debris being deposited on the sensor window; and
one or more processors configured to:
generate a map of the capacitance differences across the sensor window; and
control a cleaning system located proximate to the housing based on the map of the capacitance differences to clear the debris from the sensor window.

2. The sensor of claim 1, wherein the sensor window consists of glass, and the ITO is applied as a film onto the glass.

3. The sensor of claim 1, wherein the sensor window consists of glass, and the ITO is etched or sputtered into the glass.

4. The sensor of claim 1, further comprising a printed circuit board (PCB) having one or more components configured to read the capacitance differences and send information regarding the capacitance differences to the one or more processors.

5. The sensor of claim 4, wherein the transparent film conductor has one or more patterns.

6. The sensor of claim 5, wherein the one or more components on the PCB detect locations of the capacitance differences relative to the one or more patterns of the transparent film conductor.

7. The sensor of claim 5, wherein the one or more patterns of the transparent film conductor include a series of circles selected to reduce interference with light passing through the sensor window.

8. The sensor of claim 5, wherein the one or more patterns of the transparent film conductor are configured to allow for detection of debris of a particular size.

9. The sensor of claim 5, wherein the one or more patterns of the transparent film conductor include a grid pattern having grid cells of varying size.

10. The sensor of claim 1, wherein the map indicates where the capacitance differences across the sensor window are located that correspond to areas of the sensor window.

11. The sensor of claim 1, wherein the map indicates a specific area of the sensor window that is being covered by debris, and wherein the one or more processors are configured to control the cleaning system to deploy a cleaning solution that targets the specific area.

12. The sensor of claim 1, wherein the map is used to determine what percentage area of the sensor window is obscured by the debris.

13. The sensor of claim 12, further comprising:
a plurality of sensor components,
wherein when the percentage area exceeds a predetermined threshold value, associated data received from one or more of the plurality of sensor components is discarded.

14. A method performed by a sensor, the method comprising:
using, by one or more processors, a transparent film conductor of a sensor window of the sensor to detect capacitance differences across the sensor window due to debris being deposited on the sensor window, wherein the transparent film conductor consists of indium tin oxide (ITO);
generating, by the one or more processors, a map of the capacitance differences across the sensor window and
controlling, by the one or more processors, a cleaning system located proximate to the sensor based on the map of the capacitance differences to clear the debris from the sensor window.

15. The method of claim 14, wherein the map indicates where the capacitance differences across the sensor window are located that correspond to areas of the sensor window.

16. The method of claim 14, wherein the map indicates a specific area of the sensor window that is being covered by debris and the cleaning system is controlled to deploy a cleaning solution that targets the specific area.

17. The method of claim 14, wherein the map is used to determine what percentage area of the sensor window is obscured by the debris.

18. The method of claim 17, wherein when the percentage area exceeds a predetermined threshold value, associated data generated by one or more of a plurality of sensor components of the sensor is discarded.

19. The method of claim 14, wherein the transparent film conductor has one or more patterns.

20. The method of claim 14, wherein the sensor window consists of glass, and the ITO is applied as a film onto the glass.

21. The method of claim 14, wherein the sensor window consists of glass, and the ITO is etched or sputtered into the glass.

22. A sensor, comprising:
- a housing;
- a sensor window including a transparent film conductor that detects capacitance differences across the sensor window due to debris being deposited on the sensor window; and
- one or more processors configured to:
  - generate a map of the capacitance differences across the sensor window; and
  - control a cleaning system located proximate to the housing based on the map of the detected capacitance differences to clear the debris from the sensor window.

* * * * *